(12) United States Patent
Lee et al.

(10) Patent No.: US 9,299,561 B2
(45) Date of Patent: Mar. 29, 2016

(54) METHOD FOR FABRICATING NITRIDE SEMICONDUCTOR THIN FILM AND METHOD FOR FABRICATING NITRIDE SEMICONDUCTOR DEVICE USING THE SAME

(71) Applicant: SAMSUNG ELECTRONICS CO., LTD., Suwon-si, Gyeonggi-do (KR)

(72) Inventors: Keon Hun Lee, Seoul (KR); Min Ho Kim, Hwaseong-si (KR); Jong Uk Seo, Suwon-si (KR); Suk Ho Yoon, Seoul (KR); Kee Won Lee, Suwon-si (KR); Sang Don Lee, Suwon-si (KR); Ho Chul Lee, Seongnam-si (KR)

(73) Assignee: SAMSUNG ELECTRONICS CO., LTD., Suwon-Si, Gyeonggi-do (KR)

( * ) Notice: Subject to any disclaimer, the term of this patent is extended or adjusted under 35 U.S.C. 154(b) by 0 days.

(21) Appl. No.: 14/250,070

(22) Filed: Apr. 10, 2014

(65) Prior Publication Data

US 2014/0370634 A1    Dec. 18, 2014

(30) Foreign Application Priority Data

Jun. 14, 2013  (KR) .......................... 10-2013-0068397

(51) Int. Cl.
   *H01L 33/02*      (2010.01)
   *H01L 21/02*      (2006.01)
   *H01L 33/00*      (2010.01)
   *H01L 33/22*      (2010.01)

(52) U.S. Cl.
   CPC ........ *H01L 21/0254* (2013.01); *H01L 21/0242* (2013.01); *H01L 21/02458* (2013.01); *H01L 21/02494* (2013.01); *H01L 21/02502* (2013.01);
   *H01L 21/02576* (2013.01); *H01L 21/02658* (2013.01); *H01L 33/007* (2013.01); *H01L 33/0075* (2013.01); *H01L 33/025* (2013.01); *H01L 33/22* (2013.01)

(58) Field of Classification Search
   CPC ................... H01L 21/02365; H01L 21/02436; H01L 21/02496; H01L 21/02518
   See application file for complete search history.

(56) References Cited

U.S. PATENT DOCUMENTS

| 6,372,608 | B1 | 4/2002  | Shimoda et al. |
| 6,645,830 | B2 | 11/2003 | Shimoda et al. |
| RE38,466  | E  | 3/2004  | Inoue et al.   |
| 6,818,465 | B2 | 11/2004 | Biwa et al.    |
| 6,818,530 | B2 | 11/2004 | Shimoda et al. |
| 6,858,081 | B2 | 2/2005  | Biwa et al.    |
| 6,924,159 | B2 | 8/2005  | Usui et al.    |
| 6,967,353 | B2 | 11/2005 | Suzuki et al.  |
| 7,002,182 | B2 | 2/2006  | Okuyama et al. |

(Continued)

FOREIGN PATENT DOCUMENTS

| JP | 2004-146605 A | 5/2004 |
| JP | 2005-057064 A | 3/2005 |

(Continued)

*Primary Examiner* — Cheung Lee
(74) *Attorney, Agent, or Firm* — McDermott Will & Emery LLP

(57) ABSTRACT

A method for fabricating a nitride semiconductor thin film includes preparing a first nitride single crystal layer doped with an n-type impurity. A plurality of etch pits are formed in a surface of the first nitride single crystal layer by applying an etching gas thereto. A second nitride single crystal layer is grown on the first nitride single crystal layer having the etch pits formed therein.

20 Claims, 10 Drawing Sheets

(56) References Cited

U.S. PATENT DOCUMENTS

| | | |
|---|---|---|
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,462,893 B2 | 12/2008 | Han et al. |
| 7,501,656 B2 | 3/2009 | Han et al. |
| 7,621,998 B2 | 11/2009 | Lee et al. |
| 7,662,488 B2 | 2/2010 | Oshima |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,829,913 B2 | 11/2010 | Shibata et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 2001/0000733 A1 | 5/2001 | Tomioka |
| 2004/0067648 A1 | 4/2004 | Morita et al. |
| 2007/0215901 A1 | 9/2007 | Shibata |
| 2009/0014713 A1* | 1/2009 | Kang et al. ............. 257/13 |
| 2010/0124814 A1 | 5/2010 | Arena |

FOREIGN PATENT DOCUMENTS

| | | |
|---|---|---|
| JP | 2009-049179 A | 3/2009 |
| JP | 2009-298676 A | 12/2009 |
| KR | 10-2004-0078209 A | 9/2004 |
| KR | 10-0772021 B1 | 10/2007 |

* cited by examiner

METHOD FOR FABRICATING NITRIDE SEMICONDUCTOR THIN FILM AND METHOD FOR FABRICATING NITRIDE SEMICONDUCTOR DEVICE USING THE SAME

CROSS-REFERENCE TO RELATED APPLICATIONS

This application claims priority to, and benefit of Korean Patent Application No. 10-2013-0068397 filed on Jun. 14, 2013, in the Korean Intellectual Property Office, the entire contents of which are hereby incorporated by reference.

TECHNICAL FIELD

The present disclosure relates to a method for fabricating a nitride semiconductor thin film and a method for fabricating a nitride semiconductor device using the same.

BACKGROUND

In general, a nitride semiconductor, which has the characteristics of emitting light within a wide range including the ultraviolet region as well as overall visible wavelength region, has come to prominence as a material used to fabricate a light emitting diode (LED) or a laser diode (LD) emitting visible light, a ultraviolet LED, and a bluish green optical device.

In order to fabricate optical devices including a nitride semiconductor, a technique of growing a nitride semiconductor as a high quality single-crystal thin film is essential. However, with the currently used growth methods, it is difficult to directly grow a high quality nitride semiconductor single crystal due to a lattice mismatch, a mismatch in coefficients of thermal expansion with respect to a growth substrate and limitations in growth conditions, and a plurality of dislocation defects may be generated.

Dislocation may propagate in a growth direction, and in particular, in a semiconductor light emitting device, dislocation proceeds through an active layer, causing degradation of device characteristics.

SUMMARY

An aspect of the present disclosure relates to a method for fabricating an excellent nitride semiconductor thin film having high quality crystals by effectively interrupting threading dislocation.

Another aspect of the present disclosure encompasses a method for fabricating a nitride semiconductor device using the nitride semiconductor thin film fabrication method.

An aspect of the present disclosure relates to a method for fabricating a nitride semiconductor thin film, including preparing a first nitride single crystal layer doped with an n-type impurity. A plurality of etch pits are formed in a surface of the first nitride single crystal layer by applying an etching gas thereto. A second nitride single crystal layer is grown on the first nitride single crystal layer having the etch pits formed therein.

The n-type impurity may include silicon (Si). An impurity concentration of n-type impurity of the first nitride single crystal layer may range from about $5 \times 10^{17}/cm^3$ to about $9 \times 10^{18}/cm^3$.

A thickness of the first nitride single crystal layer may range from about 100 nm to 500 nm. A width of each pit may be equal to or less than about 1 μm.

The etching gas may include a gas selected from the group consisting of HCl, HBr, $SiH_4$, $SiCl_4$, and a mixture thereof.

The etching gas may be a mixture gas of $SiH_4$, $H_2$, and $NH_3$, and the forming of the etch pits may be performed at a temperature equal to or higher than about 1,000° C. for five minutes or more.

The method may further include applying an etching gas to an upper surface of the second nitride single crystal layer to form pits, after the growth of the second nitride single crystal layer. An additional nitride single crystal layer may be formed on the second nitride single crystal layer, repeatedly at least once.

The second nitride single crystal layer may be a nitride layer doped with the n-type impurity.

The preparing of the first nitride single crystal layer doped with the n-type impurity may include growing a base nitride layer, which is intentionally doped with no impurity, on a nitride single crystal growth substrate. The first nitride single crystal layer may be grown on the base nitride layer.

Still another aspect of the present disclosure encompasses a method for fabricating a nitride semiconductor thin film, including preparing a first nitride single crystal layer doped with an n-type impurity. A plurality of etch pits may be formed in a surface of the first nitride single crystal layer by applying an etching gas thereto. A second nitride single crystal layer may be grown on the first nitride single crystal layer having the etch pits formed therein. A semiconductor light emitting laminate including an active layer may be grown on the second nitride single crystal layer.

The second nitride single crystal layer may be a nitride single crystal layer doped with the n-type impurity. The growth of the semiconductor light emitting laminate may include sequentially growing the active layer and a p-type nitride layer on the second nitride single crystal layer.

The growth of the semiconductor light emitting laminate may include sequentially growing an n-type nitride layer, the active layer, and a p-type nitride layer on the second nitride single crystal layer.

Another aspect of the present disclosure relates to a method for fabricating a nitride semiconductor thin film, including preparing a first nitride single crystal layer doped with an n-type impurity. A plurality of etch pits are formed in a surface of the first nitride single crystal layer by applying an etching gas thereto. A second nitride single crystal layer is grown on the first nitride single crystal layer such that the formed etch pits are filled with the second nitride single crystal layer.

The n-type impurity may include silicon (Si).

The method may further include applying an etching gas to an upper surface of the second nitride single crystal layer to form pits, after the growth of the second nitride single crystal layer. An additional nitride single crystal layer may be formed on the second nitride single crystal layer, repeatedly at least once.

The second nitride single crystal layer may be a nitride layer doped with the n-type impurity.

The preparing of the first nitride single crystal layer doped with the n-type impurity may include growing a base nitride layer, which is intentionally doped with no impurity, on a nitride single crystal growth substrate. The first nitride single crystal layer may be grown on the base nitride layer.

BRIEF DESCRIPTION OF THE DRAWINGS

The above and other aspects, features and other advantages of the present disclosure will be more clearly understood from the following detailed description taken in conjunction with the accompanying drawings, in which like reference characters may refer to the same or similar parts throughout the different views. The drawings are not necessarily to scale, emphasis instead being placed upon illustrating the principles of the embodiments of the present inventive concept. In the drawings, the thickness of layers and regions may be exaggerated for clarity.

DETAILED DESCRIPTION

Figure 1A:
FIGS. 1A through 1D are cross-sectional views illustrating processes of a method for fabricating a nitride semiconductor thin film according to an embodiment of the present disclosure.

Hereinafter, embodiments of the present disclosure will be described in detail with reference to the accompanying drawings. The present inventive concept may, however, be embodied in many different forms and should not be construed as being limited to the embodiments set forth herein. Rather, these embodiments are provided so that this disclosure will be thorough and complete, and will fully convey the scope of the present inventive concept to those skilled in the art. In the drawings, the shapes and dimensions of elements may be exaggerated for clarity, and the same reference numerals will be used throughout to designate the same or like components.

FIGS. 1A through 1D are cross-sectional views illustrating processes of a method for fabricating a nitride semiconductor thin film according to an embodiment of the present disclosure.

First, as illustrated in FIG. 1A, the method for fabricating a nitride semiconductor thin film according to an embodiment of the present disclosure may start from growing a base nitride layer 12 on a nitride growth substrate 11.

The nitride growth substrate 11 may be typically a sapphire substrate, but the present inventive concept is not limited thereto and a heterogeneous substrate made of a material selected from SiC, Si, $MgAl_2O_4$, MgO, $LiAlO_2$, and $LiGaO_2$, or a homogeneous substrate such as a GaN substrate.

The base nitride layer 12 may be grown on the substrate 11 by using a process such as metal-organic chemical vapor deposition (MOCVD), molecular beam epitaxy (MBE), hydride vapor phase epitaxy (HVPE), or the like. The base nitride layer 12 may be a nitride layer intentionally undoped in order to obtain desired crystallinity in an initial growth stage. The base nitride layer 12 may be made of $Al_xIn_yGa_{(1-x-y)}N$ ($0 \le x \le 1$, $0 \le y \le 1$, $0 \le x+y \le 1$) and may be, for example, undoped GaN.

When the substrate 11 is a sapphire substrate, a crystal plane in a c-axis direction may be provided as an upper surface, and the base nitride layer 12 may be grown in an [0001] axis direction. However, the present inventive concept is not limited thereto.

Figure 1B:
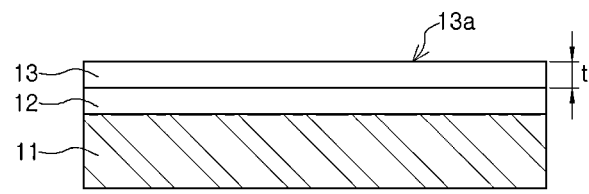

Subsequently, as illustrated in FIG. 1B, a first nitride single crystal layer 13 doped with an n-type impurity may be grown on the base nitride layer 12.

The first nitride single crystal layer 13 may be grown through a known process such as MOCVD, MBE, HVPE, or the like. In an embodiment of the present inventive concept, the first nitride single crystal layer 13 may be provided as a nitride single crystal doped with the n-type impurity. For example, the n-type impurity may be silicon (Si).

Although the first nitride single crystal layer 13 is formed on the base nitride layer 12, dislocation present in the base nitride layer 12 may propagate in the growth direction. The first nitride single crystal layer 13 may be made of $Al_xIn_yGa_{(1-x-y)}N$ ($0 \le x \le 1$, $0 \le y \le 1$, $0 \le x+y \le 1$), and may be an N-type GaN doped with silicon (Si), for example.

In a particular example, the base nitride layer 12 and the first nitride semiconductor layer may be formed through a continuous GaN growth process, and in this case, a desired flow rate of silicon (Si) source may be provided in a growth section of the first nitride semiconductor layer.

The first nitride single crystal 13 may be provided as a region in which etch pits are formed, and may have a thickness t ranging from about 100 nm to about 500 nm.

Figure 1C:
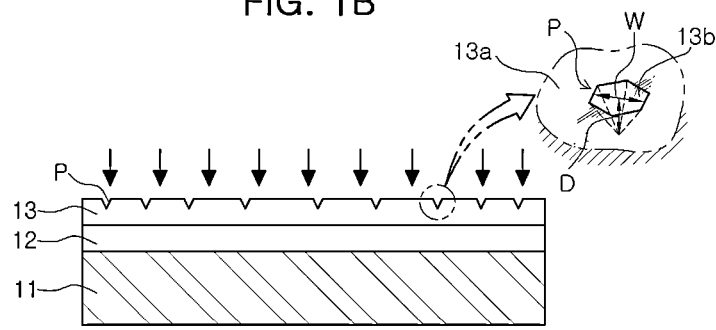

Thereafter, as illustrated in FIG. 1C, an etching gas may be applied to an upper surface 13a of the first nitride single crystal layer 13 to form a plurality of etch pits P on the surface thereof.

The etching gas employable in this process may be used by generating etching in an upper end of dislocation in the upper surface 13a of the nitride single crystal. In this case, the etching gas may include an etching gas selected from HCl, HBr, $SiH_4$, $SiCl_4$, and a mixture thereof, but the present inventive concept is not limited thereto. The etching gas may be mixed with at least one of $H_2$, $N_2$, $NH_3$, and Ar and used.

In order to enhance an etching effect, the etching process may be performed at a temperature of about 1000° C. or higher and a sufficient period of time may be applied to form etch pits having a desired size and arrangement. For example, about 5 minutes or more may be applied for the etching process.

The etching process may be implemented by injecting an etching gas at an appropriate temperature. Thus, the etching process may be performed in an in-situ state without unloading the substrate from within a reaction chamber for nitride single crystal growth.

As described above, the etch pits P formed during this process may be positioned in the upper end of dislocation, and may have a relatively regular distribution. As illustrated in the enlarged view of FIG. 1C, each pit P has a hexagonal pyramidal shape. For example, when the upper surface 13 of the first nitride single crystal layer 13 is in an [0001] axis direction, a sloped face 13b of each pit P may be a stable non-polar crystal plane such as an S plane.

The pit P having a hexagonal pyramidal shape may have a width W equal to or smaller than about 1 µm so as to be filled with a nitride single crystal therein during a follow-up growth process. A depth D of the pit P, dependent upon the width W, may be understood as having a range less than about 1.6 µm.

Figure 1D:
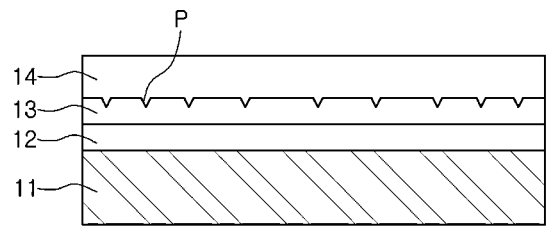

Thereafter, as illustrated in FIG. 1D, a second nitride single crystal layer 14 may be grown on the first nitride single crystal layer 13.

A process of growing the second nitride single crystal layer 14 may be performed under process conditions in which two-dimensional (2D) growth, namely, a lateral growth mode, is strengthened such that the pits P formed on the first nitride single crystal layer 13 may be filled with the second nitride single crystal layer 14. Namely, unlike general nitride single crystal growth performing at a relatively fast growth rate (e.g., faster than about a few µm/h or more), growth pressure and a growth rate are lowered and a growth temperature is increased to induce 2D growth, thereby allowing crystal to grow from the crystal planes of the pit.

The second nitride single crystal layer 14 obtained from the growth may interrupt dislocation moving from the first nitride single crystal layer 13 or change a moving direction thereof, thus restrain formation of threading dislocation that exerts a bad influence on reliability of a device.

This growth process may be continuously performed without having to unload the substrate from within a reaction chamber used during the growth and etching process of the first nitride single crystal layer 13.

A principle of improving crystallinity of the second nitride single crystal layer, along with formation of etch pits, described above with reference to FIGS. 1C to 1D will be described in detail with reference to FIGS. 2A through 2C.

Figure 2A:
FIGS. 2A through 2C are schematic views illustrating a principle of regrowing a nitride semiconductor thin film employed in an embodiment of the present disclosure.
Figure 2B:
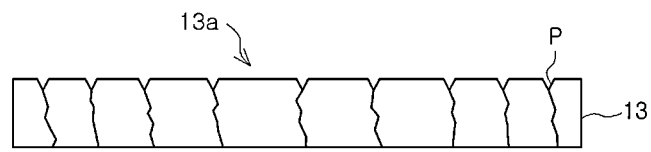

As illustrated in FIG. 2A, the first nitride single crystal layer 13 may include dislocation d moving in a growth direction. For example, dislocation density may range from about $10^9$ to about $10^{10}$ cm$^{-2}$. When inevitably generated dislocation continuously moves in the growth direction, a leakage current may be generated through the device (in particular, an active layer) to exert a bad influence on reliability of the device. Thus, in order to reduce dislocation density, a process of interrupting dislocation or changing the direction of dislocation may be required.

The first nitride single crystal layer 13 employed in an embodiment of the present disclosure may be doped with the n-type impurity such as silicon (Si). Impurity such as silicon (Si) doped on a matrix of a nitride single crystal such as GaN is highly likely to be positioned in the vicinity of dislocation.

When an etching gas may be applied to the first nitride single crystal layer 13, portions of dislocation to which silicon (Si) is adjacent tend to be easily etched. Due to this tendency, upper ends of each dislocation where silicon (Si) is positioned may be etched at a similar etching rate, and as a result, as illustrated in FIG. 2B, etch pits P having a relatively uniform size may be formed.

Also, since the silicon (Si) impurity is relatively evenly distributed to the entire region of the first nitride single crystal layer 13, the entire region of the first nitride single crystal layer 13 may also have the same effect of silicon (Si). Resultantly, the etch pits P may also be relatively evenly distributed in the entire surface. This will be described in detail through the following embodiments.

In order to obtain such an effect, an impurity concentration of the impurity such as silicon (Si) may range from about $5\times10^{17}$/cm$^3$ to about $9\times10^{18}$/cm$^3$. If the impurity concentration is less than about $5\times10^{17}$/cm$^3$, the effect of uniform size and arrangement of the etch pits as described above is low, and if the impurity concentration exceeds $9\times10^{18}$/cm$^3$, crystallinity may be degraded due to the relatively high impurity concentration.

Figure 2C:
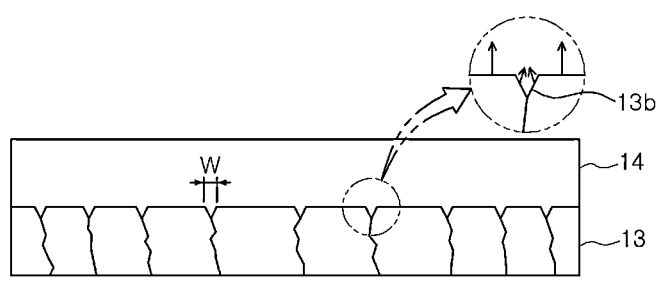

Thereafter, as illustrated in FIG. 2C, when the second nitride single crystal layer 14 is grown, the second nitride single crystal layer 14 may be grown to fill the pits P. In detail, as shown in the circled enlarged portion (see FIG. 2C), the second nitride signal crystal layer 14 is grown from respective crystal planes of the pits P and merged to interrupt dislocation in a moving direction, thereby enhancing crystallinity. Also, although dislocation is not interrupted during the merging process, dislocation moving in the vertical direction may be changed to have a different direction, thereby reducing an influence on reliability of the device.

Hereinafter, effects and operations of an example (referred to as "Example E") of the present inventive concept in comparison to comparative examples will be described in detail.

Example E

An undoped GaN layer having a thickness of about 100 nm was grown on a c plane of a sapphire substrate. Subsequently, a silicon (Si)-doped GaN layer was formed to have a thickness of about 250 nm on the undoped GaN layer. Here, the impurity concentration of silicon (Si) was about $6\times10^{18}$/cm$^3$.

Thereafter, a surface of the silicon (Si)-doped GaN layer was etched at a temperature of about 1,220° C. for about 10 minutes by using a mixture gas of SiH$_4$ (abut 200 ppm):NH$_3$:H$_2$ (volume ratio: 0.1:140:40) as an etching gas.

Thereafter, a silicon (Si)-doped GaN layer was grown to have a thickness of about 500 nm on the surface of the etched silicon (Si)-doped GaN layer.

Comparative Example A

An experiment was conducted under similar conditions to those of Example E, except that a GaN:Si layer was not used. Namely, an undoped GaN layer having a thickness of about 250 nm was grown on the c plane of a sapphire substrate.

Thereafter, the undoped GaN layer was treated under the same conditions as those of Example E to form etch pits. Namely, a surface of the undoped GaN layer was etched at a temperature of about 1,220° C. for about 10 minutes by using a mixture gas of SiH$_4$ (about 200 ppm):NH$_3$:H$_2$ (a volume ratio: 0.1:140:40).

Thereafter, a silicon (Si)-doped GaN layer having a thickness of about 500 nm was grown on the etched undoped GaN layer.

Figure 3A:
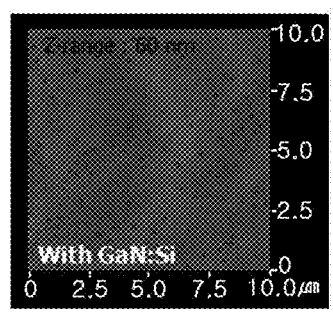
FIGS. 3A and 3B are scanning electron microscope (SEM) photographs of surfaces of nitride semiconductor layers having pits formed therein according to an embodiment of the present disclosure (referred to as "Example E") and Comparative example A, respectively.
Figure 3B:
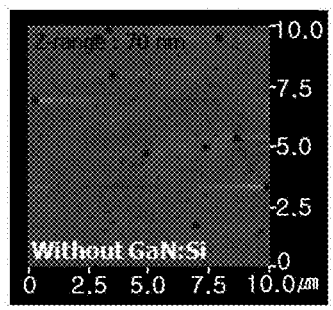

Surfaces of the GaN layers obtained through the surface treatment according to Example E and Comparative example A were checked. FIGS. 3A and 3B are scanning electron microscope (SEM) photographs of surfaces of nitride semiconductor layers having pits formed according to Example E and Comparative example A, respectively.

As illustrated in FIG. 3A, majority (about 80% or more) of etch pits formed in the surface of the silicon (Si)-doped GaN (Ga:Si) layer had relatively uniform sizes ranging from about 150 nm to about 200 nm, and in particular, etch pits were evenly distributed on the entire area. In comparison, as illustrated in FIG. 3B, large etch pits (more than 500 nm) as well as small etch pits (less than 100 nm) were formed in the undoped GaN layer. Thus the etch pits in the undoped GaN layer were distributed in an irregularly scattered manner, unlike those of Example E.

Thus, it was confirmed that although the same surface treatment conditions were applied, etch pits can be uniformly formed in size and distribution due to the doping effect of the silicon (Si) impurity.

In addition, degrees of crystallinity of the GaN:Si layer grown on the surface of the etched GaN:Si layer were compared. XRD diffractometry was conducted on (102) planes of the finally silicon (Si)-doped GaN layers obtained according to Example E and Comparative example A, and results thereof are shown in FIG. 4A (Example E) and FIG. 4B (Comparative example A).

Figure 4A:
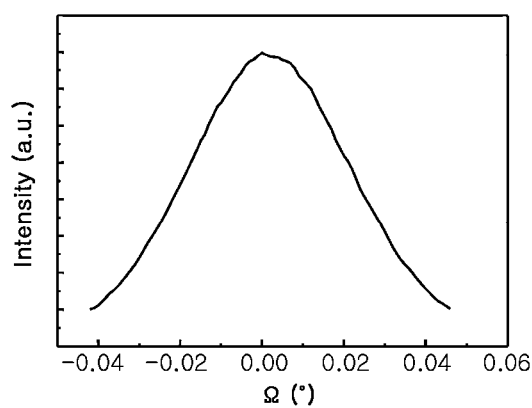
FIGS. 4A and 4B are graphs showing the results of XRD diffractometry performed on (102) planes of finally Si-doped GaN layers according to Example E and Comparative example A.
Figure 4B:
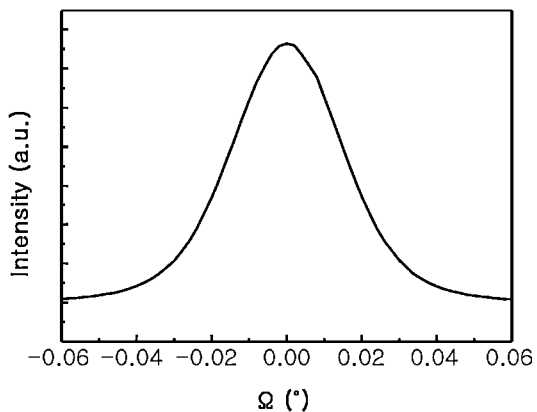

Referring to the graphs of FIGS. 4A and 4B, it can be seen that a rocking curve with respect to the (102) plane of the silicon (Si)-doped GaN layer obtained according to Example E (FIG. 4B) is sharper than the rocking curve with respect to the (102) plane of the silicon (Si)-doped GaN layer obtained according to Comparative example A (FIG. 4A). It means that the silicon (Si)-doped GaN layer obtained under the conditions of an embodiment of the present disclosure (e.g., Example E) has improved crystallinity, relative to the silicon (Si)-doped GaN layer obtained under the conditions of Comparative example A.

In this manner, it can be confirmed that, by uniformly forming the etch pits in the surface of the GaN layer doped with the n-type impurity, crystallinity of the nitride single crystal layer grown thereon is further enhanced.

Comparative Example B

An experiment was performed in a manner similar to that of Example E, and a different period of time for a surface treatment of the GaN: Si layer was applied.

Namely, an undoped GaN layer having a thickness of about 100 nm was grown on a c plane of a sapphire substrate. Subsequently, a GaN:Si layer having a thickness of about 250 nm was formed on the undoped GaN layer. Here, the impurity concentration of silicon (Si) was about $6 \times 10^{18}/cm^3$.

Thereafter, a surface of the GaN:Si layer was etched at a temperature of about 1,220° C. for about 10 minutes by using a mixture gas of $SiH_4$ (about 200 ppm):$NH_3$:$H_2$ as an etchant gas (a volume ratio: 0.1:140:40).

Figure 5A:
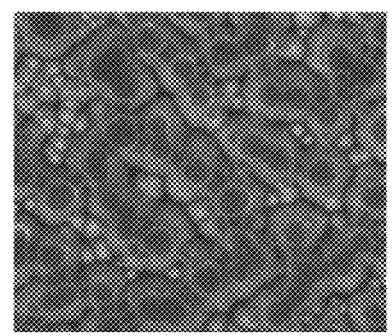
FIGS. 5A and 5B are SEM photographs (a plan view and a bird-eye view) of surfaces of the nitride semiconductor layer having pits formed therein according to the embodiment E.
Figure 5B:
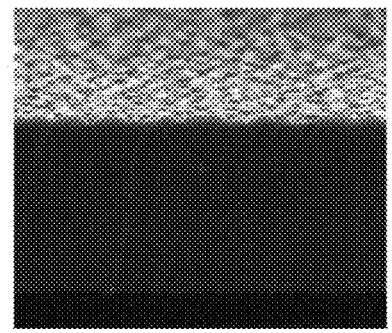
Figure 6A:
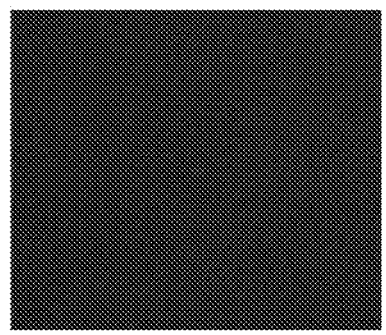
FIGS. 6A and 6B are SEM photographs (a plan view and a bird-eye view) of surfaces of the nitride semiconductor layer having pits formed therein according to Comparative example B.
Figure 6B:
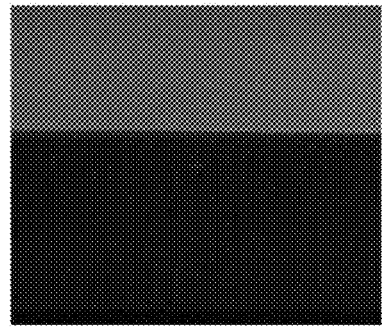

FIGS. 5A and 5B are SEM photographs (a plan view and a bird-eye view) of surfaces of the nitride semiconductor layer having pits formed therein according to Example E, and FIGS. 6A and 6B are SEM photographs (a plan view and a bird-eye view) of surfaces of the nitride semiconductor layer having pits formed therein according to Comparative example B.

As illustrated in FIGS. 5A and 5B, it can be seen that etch pits were formed in the surface of the GaN:Si layer, while, in FIGS. 6A and 6B, it can be seen that etch pits were not formed because a surface treatment was not applied for a sufficient period of time. Thus, it can be confirmed that, in order to form etch pits, a surface-treatment may be required to be applied for a sufficient period of time according to surface treatment conditions (in particular, an etching gas and/or a treatment temperature).

In an embodiment of the present disclosure, in the case of the mixture gas of $SiH_4$, $H_2$, and $NH_3$, a surface treatment for forming etch pits may be performed appropriately at a temperature of about 1,000° C. or higher for about 5 minutes or more.

In a method for fabricating a nitride semiconductor thin film, an etching process and a re-growth process may be repeatedly performed in-situ in order to grow a nitride single crystal having quality crystallinity.

FIGS. 7A through 7D are cross-sectional views illustrating processes of a method for fabricating a nitride semiconductor thin film according to another embodiment of the present disclosure.

Figure 7A:
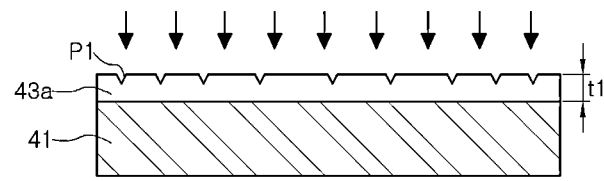
FIGS. 7A through 7D are cross-sectional views illustrating processes of a method for fabricating a nitride semiconductor thin film according to another embodiment of the present disclosure.

First, as illustrated in FIG. 7A, a first nitride single crystal 43a doped with the n-type impurity may be grown on a substrate 41 for a nitride growth, and an etching gas may be applied to an upper surface of the first nitride single crystal 43a to form a plurality of pits P1.

The substrate 41 for a nitride growth may typically be a sapphire substrate. A thickness t1 of the first nitride single crystal layer 43a may be appropriately set such that dislocation density may not be increased in the nitride single crystal. For example, the thickness t1 may range from about 150 nm to about 500 nm.

The first nitride single crystal layer 43a may be doped with the n-type impurity such as silicon (Si), and the impurity concentration of an impurity such as silicon (Si) may range from about $5 \times 10^{17}/cm^3$ to about $9 \times 10^{18}/cm^3$.

In an embodiment of the present disclosure, a gas selected from HCl, HBr, $SiH_4$, $SiCl_4$, and a mixture thereof may be used as the etching gas, but the present inventive concept is not limited thereto. Such a gas may be mixed with at least one of $H_2$, $N_2$, $NH_3$, and Ar and used in actuality. In order to enhance an etching effect, the etching process may be performed at a temperature equal to or higher than 1,000° C. for five minutes or more.

Figure 7B:
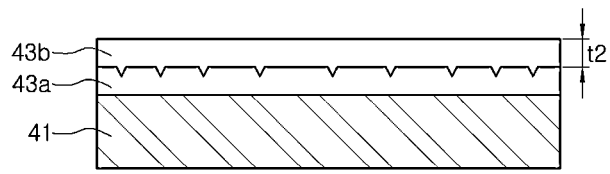

Subsequently, as illustrated in FIG. 7B, a second nitride single crystal 43b is grown on the first nitride single crystal 43a with a thickness t2 to fill the etch pits P1.

As described above, the second nitride single crystal layer 43b may be provided as a crystal layer having significantly reduced dislocation density through a 2D growth process filling the etch pits. In order to realize the growth process to fill the etch pits, each etch pit may have a width W equal to or less than about 1 μm in FIG. 7A.

In spite of such processes, dislocation may still exist in the second nitride single crystal layer 43b, so the etch pit formation and regrowth processes may be additionally performed at least once. Namely, the processes illustrated in FIGS. 7C and 7D may be additionally performed.

Figure 7C:
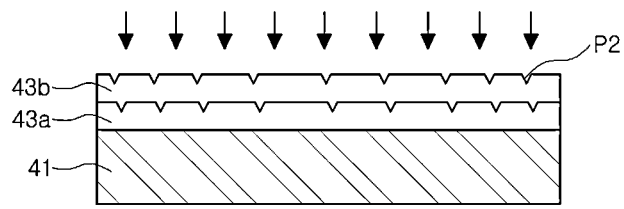

Thereafter, as illustrated in FIG. 7C, the process of applying an etching gas to the second nitride single crystal 43b may be performed again to form a plurality of pits P2. The etching process may be performed under conditions similar to those described above with reference to FIG. 7A.

The foregoing etching gas may be injected into a nitride growth chamber and applied to the surface of the second nitride single crystal 43b to induce etching on an upper end of dislocation, forming the pits P2 having a hexagonal pyramidal shape on an upper surface of the second nitride single crystal 43b.

In an embodiment of the present disclosure, the second nitride single crystal layer 43b may be also grown, while additionally doping n-type impurity, whereby the etch pits formed in the surface treatment process may have the same size and evenly distributed in the entire area according to the doping effect of the n-type impurity. The first nitride single crystal layer 43a may be doped with the n-type impurity such as silicon (Si), and the impurity concentration of the second nitride single crystal layer 43b may ranged from about $5 \times 10^{17}/cm^3$ to about $9 \times 10^{18}/cm^3$. However, as necessary, the second nitride single crystal layer 43b may have impurity concentration different from that of the first nitride single crystal layer 43a.

Figure 7D:
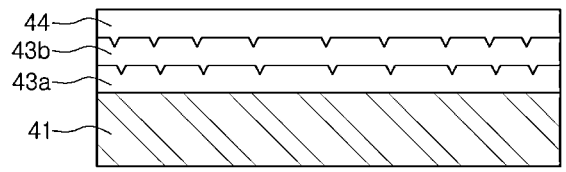

During the process illustrated in FIG. 7D, a third nitride single crystal 44 may be grown on an upper surface of the second nitride single crystal 43b with a plurality of pits formed therein. Here, the third nitride single crystal 44 may be grown in a manner similar to that of the nitride single crystal grown concurrently in the lateral growth mode as described above with reference to FIG. 7B, obtaining excellent crystallinity.

In this manner, the surface treatment process to form etch pits and the regrowth process may be repeatedly performed by a desired number of times to significantly enhance crystallinity. Also, since the processes may be continuously performed in-situ, process efficiency can be enhanced.

The method for growing a nitride single crystal according to an embodiment of the present disclosure may be advantageously employed in a method for manufacturing a light emitting diode (LED) having excellent reliability.

Figure 8:
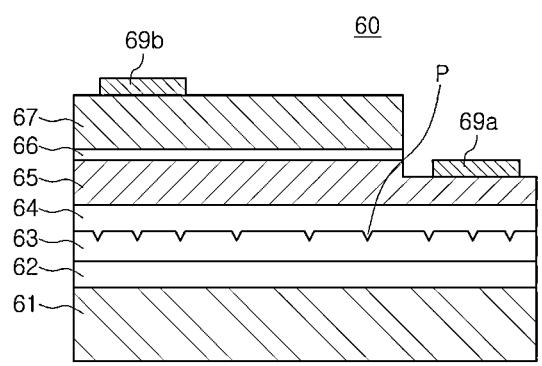
FIG. 8 is a cross-sectional view illustrating an example of a nitride semiconductor light emitting device that may be fabricated by using a method according to an embodiment of the present disclosure.

FIG. 8 is a cross-sectional view of a nitride semiconductor light emitting device employing a nitride semiconductor thin film fabricated according to the method according to an embodiment of the present disclosure.

As illustrated in FIG. 8, a nitride semiconductor light emitting device 60 may include a base nitride layer 62 formed on a substrate 61, and a first nitride single crystal layer 63 and a second nitride single crystal layer 64 sequentially formed on the base nitride layer 62.

Also, the nitride semiconductor light emitting device 60 may include a first conductivity-type nitride semiconductor layer 65, an active layer 66, and a second conductivity-type nitride semiconductor layer 67. Also, first and second electrodes 69a and 69b may be provided on the first and second conductivity-type nitride layers 65 and 67, respectively.

In an embodiment of the present disclosure, the base crystal layer 62 may be an undoped nitride layer which is intentionally not doped with any impurity. The first nitride crystal layer 63 may be a nitride semiconductor layer doped with the n-type impurity such as silicon (Si). After etch pits are formed in a surface of the first nitride single crystal layer 63, the second nitride single crystal 64 may be grown thereon. This process may be similar to the process of growing the nitride thin film described above with reference to FIGS. 1A through 1D.

In detail, after the first nitride single crystal layer 63 doped with impurity such as silicon (Si) is grown on the base nitride layer 62, an etching gas may be applied thereto to form a plurality of pits P on the first nitride single crystal layer 63. The plurality of pits P may be formed in an upper end of dislocation. The plurality of pits P may be formed to have a relatively uniform size and formed to be evenly distributed on the surface of the first nitride single crystal layer 63.

The second nitride single crystal layer 64 may be formed in a 2D growth mode such that the plurality of pits P are filled with the second nitride single crystal layer 64. The second nitride single crystal layer 64 obtained resultantly may have excellent crystallinity. Thus, crystallinity of the first and second conductivity-type nitride semiconductor layers 65 and 67 and the active layer 66 formed on the second nitride single crystal layer 64 is also considerably improved, ending up with fabrication of the nitride semiconductor light emitting device 60 having reliability.

In FIG. 8, it is illustrated that the second nitride single crystal layer 64 and the first conductivity-type nitride semiconductor layer 65 may be sequentially formed through separate processes, for example, but in this case, the second nitride single crystal layer 64 may be doped with first conductivity-type impurity (e.g., n-type impurity) to form a first conductivity-type nitride semiconductor layer 65.

Also, the nitride single crystal growth process according to an embodiment of the present disclosure may be employed for a separate crystalline structure in the substrate to improve the growth conditions of the first conductivity-type nitride semiconductor layer 65 as in the embodiment illustrated in FIG. 8, but the nitride single crystal growth process may also be introduced to a middle portion or an upper portion of the first conductivity-type nitride semiconductor layer 65.

In the embodiment illustrated in FIG. 8, the nitride layer formed on the etch pits may be positioned below the active layer, but according to a structure of a nitride semiconductor light emitting device, the nitride layer formed on the etch pits may be positioned above the active layer in a final structure. This embodiment is illustrated in FIGS. 9A and 9B.

Figure 9A:
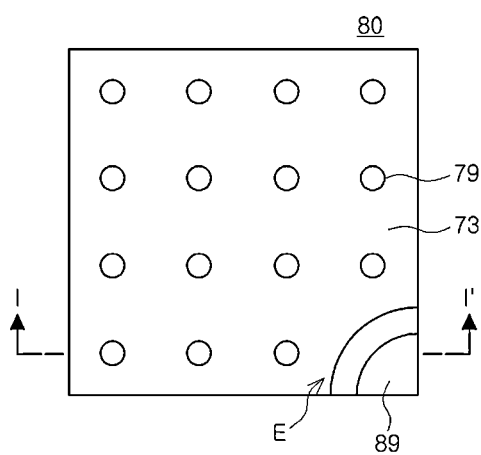
FIGS. 9A and 9B are a top plan view and a cross-sectional view illustrating another example of a nitride semiconductor light emitting device that may be fabricated by using a method according to an embodiment of the present disclosure.
Figure 9B:
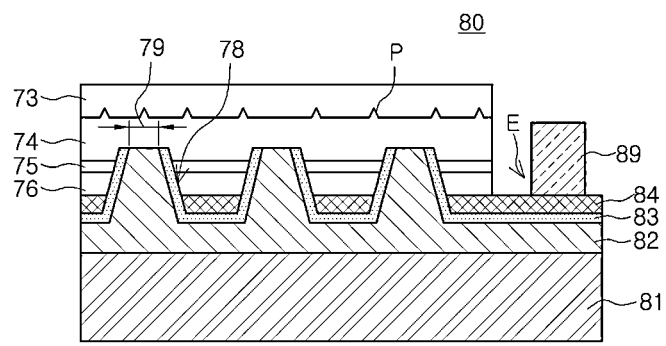

As illustrated in FIGS. 9A and 9B, a semiconductor light emitting device 80 may include a conductive substrate 81, a first electrode layer 82, an insulating layer 83, a second electrode layer 84, a second conductivity-type semiconductor layer 76, an active layer 75, and a first conductivity-type semiconductor layer 74.

The first electrode layer 82 may be laminated on the conductive substrate 81. Contact holes 78 may be formed to penetrate through the insulating layer 83, the second electrode layer 84, the second conductivity-type semiconductor layer 76, the active layer 75, and certain regions of the first conductivity-type semiconductor layer 74. Portions of the first electrode layer 82 may extend through the contact holes 78 to come into contact with the first conductivity-type semiconductor layer 74, whereby the conductive substrate 81 and the first conductivity-type semiconductor layer 74 are electrically connected.

Namely, the first electrode layer 82 may electrically connect the conductive substrate 81 and the first conductivity-type semiconductor layer 74 through the contact holes 78. In detail, the conductive substrate 81 and the first conductivity-type semiconductor layer 74 may be electrically connected by the size of the contact holes 78, specifically, a contact region 79 in which the first electrode layer 82 and the first conductivity-type semiconductor layer 74 are in contact through the contact holes 78.

Meanwhile, the insulating layer 83 may be formed on the first electrode layer 82 to electrically insulate (or separate) the first electrode layer 82 from the layers other than the conductive substrate 81 and the first conductivity-type semiconductor layer 74. Namely, the insulating layer 83 may be provided between the first electrode layer 82 and sides of the second electrode layer 84, the second conductivity-type semiconductor layer 76, and the active layer 75 exposed by the contact hole 78, as well as between the first electrode layer 82 and the second electrode layer 84. In addition, the insulating layer 83 may also be formed on the sides of predetermined regions of the first conductivity-type semiconductor layer 74 through which the contact holes 78 penetrate to insulate the same.

The second electrode layer 84 may be provided on the insulating layer 83. The second electrode layer 84 may not exist in predetermined regions through which the contact holes 78 penetrate. Here, as illustrated in FIG. 9B, the second electrode layer 84 may have one or more exposed regions in the interface between the second electrode layer 84 and the second conductivity-type semiconductor layer 76, i.e., an exposed region E. An electrode pad part 89 connecting an external power source to the second electrode layer 84 may be provided on the exposed region E.

Also, a semiconductor light emitting laminate may not be formed in the exposed region E. As illustrated in FIG. 9A, the exposed region E may be formed in the corner of the semiconductor light emitting device 80. This scheme aims to maximize a light emitting area of the semiconductor light emitting device 80. Meanwhile, the second electrode layer 84 may be formed of any one metal among silver (Ag), aluminum (Al), and platinum (Pt). This is due to the fact that since the second electrode layer 84 is in electrical contact with the second conductivity-type semiconductor layer 76, the second electrode layer 84 may be provided as a layer having the characteristics of minimizing contact resistance of the second conductivity-type semiconductor layer 76 and having a function of enhancing luminous efficiency by reflecting light generated by the active layer 75 such that light moves outwardly.

The second conductivity-type semiconductor layer 76 may be provided on the second electrode layer 84. The active layer 75 may be provided on the second conductivity-type semiconductor layer 76. The first conductivity-type semiconductor layer 74 may be provided on the active layer 75. Here, the first conductivity-type semiconductor layer 74 may be an n-type nitride semiconductor and the second conductivity-type semiconductor layer 76 may be a p-type nitride semiconductor.

As illustrated in FIG. 9B, the semiconductor light emitting device 80 may include a nitride single crystal layer 73 doped with the n-type impurity formed on the first conductivity-type semiconductor layer 74. As described above, the n-type nitride single crystal layer 73 may have a plurality of etch pits P formed in a surface thereof facing the first conductivity-type semiconductor layer 74. As described above, the etch pits P formed in the n-type nitride single crystal layer 73 may have the same size and a relatively uniform distribution on the whole due to a doping effect of the n-type impurity.

The semiconductor light emitting device 80 illustrated in FIGS. 9A and 9B may be fabricated as follows. The n-type nitride single crystal layer 73 may be formed on a growth substrate (not shown), and be subjected to a surface treatment process to form the etch pits P thereon. Thereafter, the first conductivity-type semiconductor layer 74, the active layer 75, and the second conductivity-type semiconductor layer 76 may be formed on the surface of the n-type nitride single crystal-layer having the etch pits formed therein, an electrode structure may be formed thereon, and the resulting structure may be transferred to the substrate 81 as a permanent substrate.

The semiconductor light emitting device may be advantageously applied to various applications, in the form of a chip or a package.

Figure 10:
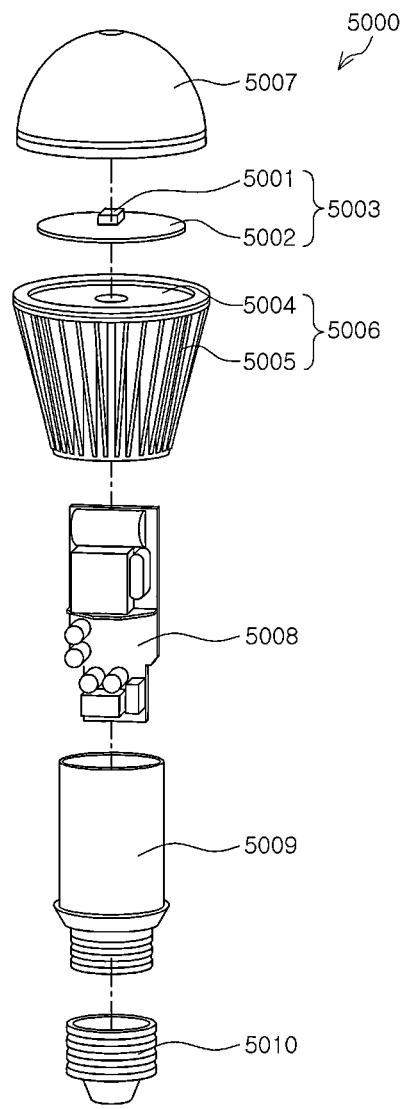
FIG. 10 is an exploded perspective view illustrating an example of a lighting device in which the foregoing semiconductor light emitting device is employable.

FIG. 10 is an exploded perspective view of a lighting device in which a semiconductor light emitting device is used as a chip or a package.

A lighting device 5000 illustrated in FIG. 10 is illustrated as, for example, a bulb type lamp. The lighting device 5000 may include a light emitting module 5003, a driving unit 5008, and an external connection unit 5010. Also, the lighting device 5000 may further include external structures such as external and internal housings 5006 and 5009 and a cover unit 5007. The light emitting module 5003 may include a semiconductor light emitting device 5001 and a circuit board 5002 on which the semiconductor light emitting device 5001 is mounted. In an embodiment of the present disclosure, the semiconductor light emitting device 5001 may be a semiconductor light emitting device package employing phosphors to provide white light.

In an embodiment of the present disclosure, a single semiconductor light emitting device 5001 may be mounted on the circuit board 5002, but the present inventive concept is not limited thereto and a plurality of semiconductor light emitting devices may be mounted as necessary.

Also, in the lighting device 5000, the light emitting module 5003 may include an external housing 5006 serving as a heat dissipation unit, and the external housing 5006 may include a heat dissipation plate 5004 disposed to be in direct contact with the light emitting module 5003 to enhance a heat dissipation effect and a heat radiating fin 5005 surrounding a lateral surface of the lighting device 5000. Also, the lighting device 5000 may include a cover unit 5007 installed on the light emitting module 5003 and having a convex lens shape. The driving unit 5008 may be installed in the internal housing 5009 and connected to an external connection unit 5010 having a socket structure to receive power from an external power source.

Also, the driving unit 5008 may serve to convert received power into an appropriate current source for driving the semiconductor light emitting device 5001 of the light emitting module 5003 and provide the current source. For example, the driving unit 5008 may be configured as an AC-DC converter, a rectifier circuit component, or the like.

As set forth above, according to embodiments of the disclosure, since etch pits using an etching gas are formed in the n-type impurity-doped nitride layer, the etch pits may have a relatively uniform size and are relatively evenly distributed, whereby a high quality nitride single crystal layer can be grown through follow-up regrowth. Also, a nitride semiconductor light emitting device having excellent reliability can be provided by using the nitride semiconductor thin film fabrication method.

While the present inventive concept has been shown and described in connection with the embodiments, it will be apparent to those skilled in the art that modifications and variations can be made without departing from the spirit and scope of the invention as defined by the appended claims.

What is claimed is:

1. A method for fabricating a nitride semiconductor thin film, the method comprising:
   preparing a first nitride single crystal doped with an n-type impurity;
   forming a plurality of etch pits in a surface of the first nitride single crystal by applying an etching gas thereto;
   growing a second nitride single crystal on the first nitride single crystal having the etch pits formed therein; and
   forming a plurality of etch pits in a surface of the second nitride single crystal by applying the etching gas thereto after the growth of the second nitride single crystal.

2. The method of claim 1, wherein the n-type impurity includes silicon (Si).

3. The method of claim 2, wherein an impurity concentration of n-type impurity of the first nitride single crystal ranges from about $5 \times 10^{17}/cm^3$ to about $9 \times 10^{18}/cm^3$.

4. The method of claim 1, wherein a thickness of the first nitride single crystal ranges from about 100 nm to about 500 nm.

5. The method of claim 1, wherein a width of each pit is equal to or less than about 1 μm.

6. The method of claim 1, wherein the etching gas includes a gas selected from the group consisting of HCl, HBr, $SiH_4$, $SiCl_4$, and a mixture thereof.

7. The method of claim 6, wherein the etching gas is a mixture gas of $SiH_4$, $H_2$, and $NH_3$, and
   the forming of the etch pits is performed at a temperature equal to or higher than about 1,000° C. for five minutes or more.

8. The method of claim 1, further comprising:
forming an additional nitride single crystal on the second nitride single crystal.

9. The method of claim 8, wherein the second nitride single crystal is a nitride layer doped with the n-type impurity.

10. The method of claim 1, wherein the preparing of the first nitride single crystal doped with the n-type impurity comprises:
growing a base nitride layer, which is intentionally doped with no impurity, on a nitride single crystal growth substrate; and
growing the first nitride single crystal on the base nitride layer.

11. The method for fabricating a nitride semiconductor thin film of claim 1, further comprising:
growing a semiconductor light emitting laminate including an active layer on the second nitride single crystal.

12. The method of claim 11, wherein the second nitride single crystal is a nitride single crystal doped with the n-type impurity, and
the growth of the semiconductor light emitting laminate comprises sequentially growing the active layer and a p-type nitride layer on the second nitride single crystal.

13. The method of claim 11, wherein the growth of the semiconductor light emitting laminate comprises sequentially growing an n-type nitride layer, the active layer, and a p-type nitride layer on the second nitride single crystal.

14. The method of claim 11, wherein the n-type impurity includes silicon (Si).

15. The method of claim 14, wherein an impurity concentration of n-type impurity of the first nitride single crystal ranges from about $5 \times 10^{17}/cm^3$ to about $9 \times 10^{18}/cm^3$.

16. The method for fabricating a nitride semiconductor thin film of claim 1,
wherein the growing the second nitride single crystal comprises growing the second nitride single crystal on the first nitride single crystal such that the formed etch pits are filled with the second nitride single crystal.

17. The method of claim 16, wherein the n-type impurity includes silicon (Si).

18. The method of claim 16, further comprising:
forming an additional nitride single crystal on the second nitride single crystal.

19. The method of claim 18, wherein the second nitride single crystal is a nitride layer doped with the n-type impurity.

20. The method of claim 16, wherein the preparing of the first nitride single crystal doped with the n-type impurity comprises:
growing a base nitride layer, which is intentionally doped with no impurity, on a nitride single crystal growth substrate; and
growing the first nitride single crystal on the base nitride layer.

* * * * *